United States Patent [19]

Uchida

[11] Patent Number: 4,608,666
[45] Date of Patent: Aug. 26, 1986

[54] SEMICONDUCTOR MEMORY
[75] Inventor: Yukimasa Uchida, Yokohama, Japan
[73] Assignee: Tokyo Shibaura Denki Kabushiki Kaisha, Kawasaki, Japan
[21] Appl. No.: 602,449
[22] Filed: Apr. 20, 1984
[30] Foreign Application Priority Data Jun. 24, 1983 [JP] Japan .................................. 58-113924

[51] Int. Cl.⁴ .............................................. G11C 13/00
[52] U.S. Cl. ..................................... 365/182; 365/189
[58] Field of Search ............... 365/182, 183, 184, 189, 365/222

[56] References Cited

U.S. PATENT DOCUMENTS 4,271,487 6/1981 Craycraft et al. ................... 365/222
4,363,110 12/1982 Kalter et al. ......................... 365/222

OTHER PUBLICATIONS

English-Language Abstract of Japanese Patent Document 57-186289.
F. Baba et al, "A 35ns 64K Static Column DRAM", IEEE, ISSCC Digest of Technical Papers, Feb. 21, 1983.
Abstract, the Transactions of the IECE of Japan, vol. E66, No. 1, (Jan. 1983).
M. Yamada et al, "A 64K bit MOS Dynamic RAM with Auto/Self Refresh Functions", Transactions of the IECE of Japan, vol. J66-C, No. 1, (1983).

*Primary Examiner*—Terrell W. Fears
*Attorney, Agent, or Firm*—Schwartz, Jeffery, Schwaab, Mack, Blumenthal & Evans

[57] ABSTRACT

A large capacity and high speed semiconductor memory is disclosed. Static memory cell rows are provided so as to correspond to dynamic memory cell rows in a dynamic memory cell array. Information is transferred with transfer means between static memory cells in the static memory cell rows and dynamic memory cells corresponding thereto. Access for a read/write operation externally required is effected to static memory cell rows.

4 Claims, 10 Drawing Figures

SEMICONDUCTOR MEMORY

BACKGROUND OF THE INVENTION

The present invention relates to a large capacity and high speed semiconductor memory.

Dynamic memories have high bit density because each memory cell is constituted by two elements comprising a transfer FET (Field Effect Transistor) and a storage capacitor. Accordingly, the dynamic memories can provide a bit density three times higher than that of static memories, e.g., with a memory cell comprising six elements. For this reason, dynamic memories are mainly used for large capacity semiconductor memories.

However, with dynamic memories, it is necessary to effect a refresh operation at predetermined time periods in order to latch memory contents stored therein. Accordingly, the number of the maximum cycle is limited at a page mode operation in which column addresses are sequentially changed to effect a read/write operation in respect to the same row.

One type of dynamic memory is shown, for instance, in "64K bit MOS dynamic RAM having Auto/Self Reflesh function" (Electro-communication society Review Vol. J66-C (No. 1), PP 62-69, January 1983, particularly 2-3 self-refresh operation left column, P. 65). Dynamic memory of this type is provided therein with a timer and a refresh counter to effect a self-reflesh operation with information fed from the refresh counter which is counted up by the timer. However, with this semiconductor memory, since sense amplifiers are used for refresh operation at a self-refresh time period, it is not possible to effect a read/write operation by externally designating an address not only in the row direction but also in the column direction during a self-refresh time period.

Further, in F. Baba et al. "A 35ns 64K Static Column DRAM", Digest of Technical Papers of 1983 IEEE International Solid-State Circuits Conference, pp. 64-65, Feb. 1983, a dynamic memory comprising static column address circuits and an address transition detecting circuit is described. The dynamic memory of this type effects column address selection after a row address is selected in the same manner as conventional static memories. Without a column address strobe signal, a read operation with respect to different column addresses is possible, resulting in high speed operation. However, with this dynamic memory cell, it is not possible to effect a write operation at a high speed and to effect a read/write operation during a refresh time period.

The drawbacks with such prior art semiconductor memories are pointed as follows:

(1) Since parasitic capacitance between a bit line and a data line is large, long access time and cycle time for a read/write operation, and long cycle time for a page mode are required, resulting in low speed operation.

(2) There exists a maximum value in connection with the number of refresh cycles at a page mode with respect to a change of column address effected when row addresses are fixed.

(3) It is impossible to perform the access for read/write operations with respect to the memory during a self-refresh operation.

(4) It is necessary to repeatedly effect a row selecting operation every a certain repetition of page mode cycles although the same row is accessed, resulting in large power consumption.

SUMMARY OF THE INVENTION

A first object of the present invention is to provide a large capacity semiconductor memory operable at a high speed.

A second object of the present invention is to provide a large capacity semiconductor memory capable of effecting a high speed read/write operation which varies column addresses with rows being fixed without limitation of the number of cycle or an accumulated cycle time in respect to a change of a column address.

A third object of the present invention is to provide a large capacity semiconductor memory enabling to effect an access for a read/write operation to the memory during a self-refresh operation.

A fourth object of the present invention is to provide a large capacity semiconductor memory having small power consumption.

To achieve these objects, there is provided a semiconductor memory comprising a static memory cell row comprising static memory cells corresponding to dynamic memory cells located in the row direction in a dynamic memory cell array, and transfer means for transferring information between the static memory cell in the static memory cell row and the dynamic memory cell corresponding thereto.

DETAILED DESCRIPTION OF THE INVENTION

Figure 1:
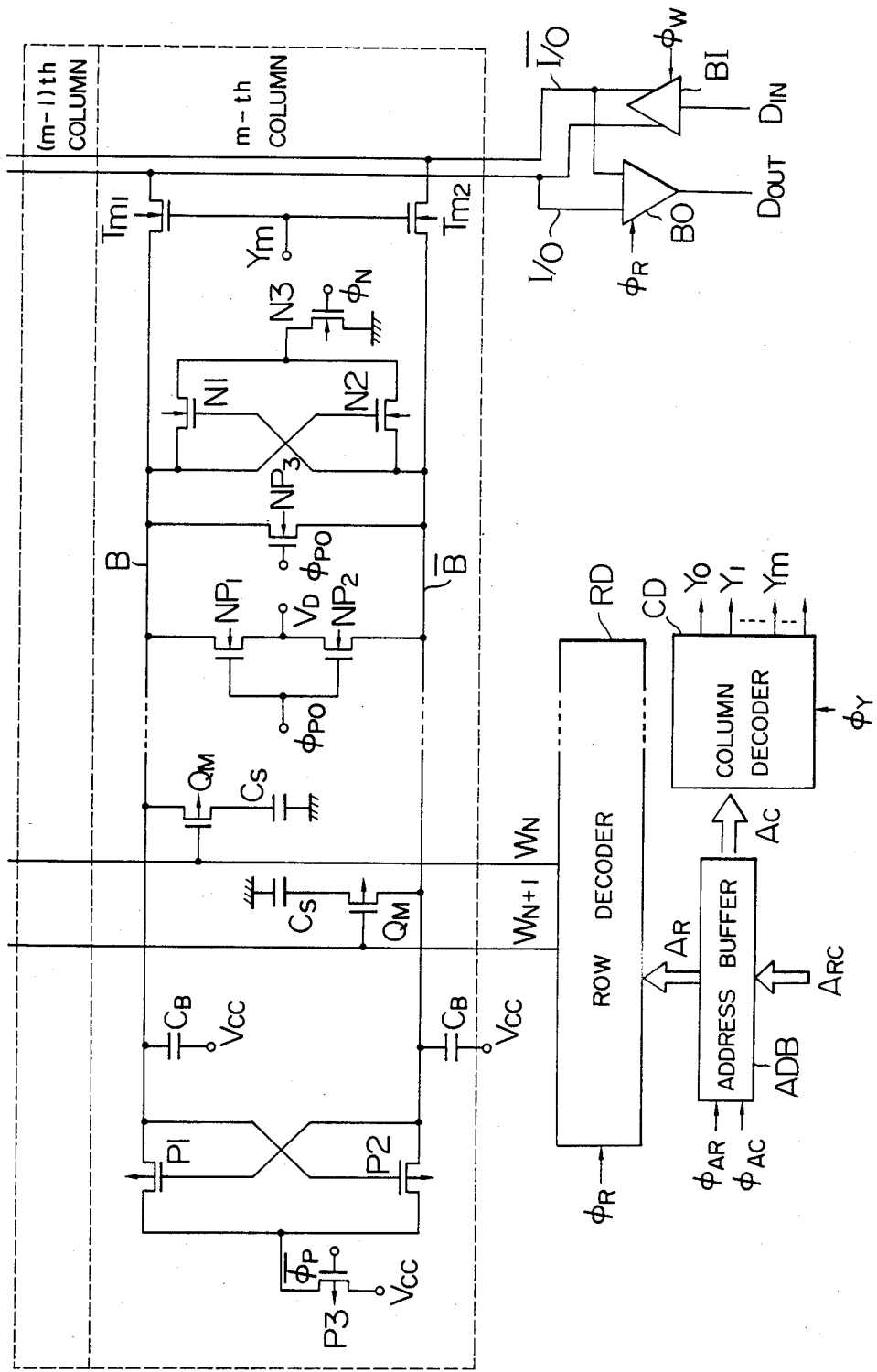
FIG. 1 is a circuit diagram illustrating a prior art semiconductor memory.

To facilitate understanding the detailed description of the invention, reference is first made to a typical example of a prior art large capacity dynamic memory described in Japanese Patent Application Laid-Open No.186289/1982 (FIG. 4A, p. 591 upper right column, line 16 to p. 592 upper right column, line 14) in conjunction with FIG. 1. To bit lines B and $\bar{B}$, dynamic memory cells each comprising a transfer PMOS FET $Q_M$ and a storage capacitor $C_S$ are connected, respectively. To each gate of transfer PMOS FETs $Q_M$, word lines $W_N$ and $W_{N+1}$ are connected, respectively. These word lines $W_N$ and $W_{N+1}$ are connected to a row decoder RD, and are driven by the row decoder RD. Additionally, parasitic electrostatic capacitors $C_B$ are coupled with the bit lines B and $\bar{B}$, respectively.

To the bit lines B and $\bar{B}$, a precharge circuit and a sense amplifier are further connected. The precharge circuit comprises NMOS FETs NP$_1$, NP$_2$ and NP$_3$. The sense amplifier is constituted by six FETs comprising a pair of NMOS FETs N$_1$ and N$_2$ which are cross-connected, a latching NMOS FET N$_3$, a pair of PMOS FETs P$_1$ and P$_2$ which are cross-connected, and a latching PMOS FET P$_3$. By a column selecting signal Y$_m$, the bit line pair B and $\overline{B}$ are selectively connected to data line pair I/O and $\overline{I/O}$ wired in the row direction through transfer gate NMOS FET pair T$_{m1}$ and T$_{m2}$. The data line pair I/O and $\overline{I/O}$ are connected to an input terminal D$_{in}$ through an input buffer B1, and are also connected to an output terminal D$_{out}$ through an output buffer B0. An address signal A$_{RC}$ externally fed allows an address buffer ADB to strobe a row address A$_R$ in synchronism with a row address strobe signal $\phi_{AR}$. The row address A$_R$ thus strobed is fed to a row decoder RD. Likewise, the address signal A$_{RC}$ allows the address buffer ADB to strobe a column address A$_C$ in synchronism with a column address strobe signal $\phi_{AC}$. The column address A$_C$ thus strobed is fed to a column decoder CD.

The operation of this dynamic memory will be described.

Gate signals $\phi_{PO}$ for the precharge circuit are input before the address strobe signal $\phi_{AR}$ is input. Thus, the precharge circuit becomes operative, thereby allowing bit lines B and $\overline{B}$ to be precharged to an intermediate potential V$_D$. When the row address strobe signal $\phi_{AR}$ becomes active, the precharge operation is finished. A predetermined row address is strobed in synchronism therewith, a row (word line W$_N$ corresponding to an address selected by the row decoder RD changes from "H" level to "L" level. As a result, the transfer FET Q$_M$ connected to the row W$_N$ becomes conductive. Thus, information stored in the storage capacitor C$_S$ of the selected memory cell appears on the bit line B. Namely, when the information stored in the storage capacitor C$_S$ is "1", a potential on the bit line B varies from V$_D$ to V$_D+\Delta V$, while when the information stored in the storage capacitor C$_S$ is "0", a potential on the bit line B varies from V$_D$ to V$_D-\Delta V$, wherein $\Delta V = C_S V_M/2(C_B + C_S)$. Then, when latch signals $\overline{\phi_N}$ and $\phi_P$ are input to each gate of the latch FETs N$_3$ and P$_3$ constituting the sense amplifier, latch FETs N$_3$ and P$_3$ become conductive. Thus, an infinitesimal signal $\Delta V$ is amplified. If the information stored in the storage capacitor C$_S$ is "1", the potential on the bit line B becomes V$_{CC}$, while the potential on the bit line $\overline{B}$ becomes 0. Alternatively, if the information stored in the storage capacitor C$_S$ is "0", the potential on the bit line B becomes 0, while the potential on the bit line $\overline{B}$ becomes V$_{CC}$. After the row address strobe signal $\phi_{AR}$ becomes active, the column address strobe signal $\phi_{AC}$ becomes active. Thus, a predetermined column address is input to the column decoder CD. In accordance with the selected column address, a gate signal Y$_m$ in respect to the selected column is selected, thereby allowing transfer gate NMOS FET pair T$_{m1}$ and T$_{m2}$ of the selected column to be conductive. Thus, the data line pair I/O and $\overline{I/O}$ are connected to the bit line pair B and $\overline{B}$. In accordance with a read control signal $\phi_R$ and a write control signal $\phi_W$, the output buffer BO and the input buffer BI are placed in an enable state, respectively. Thus, a read operation or a write operation is performed.

A read operation or a write operation is continuously effected within the same row by successively changing the column address strobe signal $\phi_{AC}$ in the condition where the row address strobe signal $\phi_{AR}$ is active, thereby continuously changing column addresses. Such a read/write operation is called "page mode operation". The maximum cycle number thereof is limited because it is necessary to effect a refresh operation at a predetermined time interval. For instance, with a 256K bit memory, its refresh cycle is 256 cycle/4 ms. In this instance, it is necessary to effect a refresh operation once every about 16 $\mu$s. However, since the page mode cycle is 160 $\mu$s and the refresh therefor is required every about 100 cycles, the maximum value of the page mode number is limited to less than 100.

Then, the present invention will be described in conjunction with a preferred embodiment shown in FIGS. 2 to 4.

Figure 2:
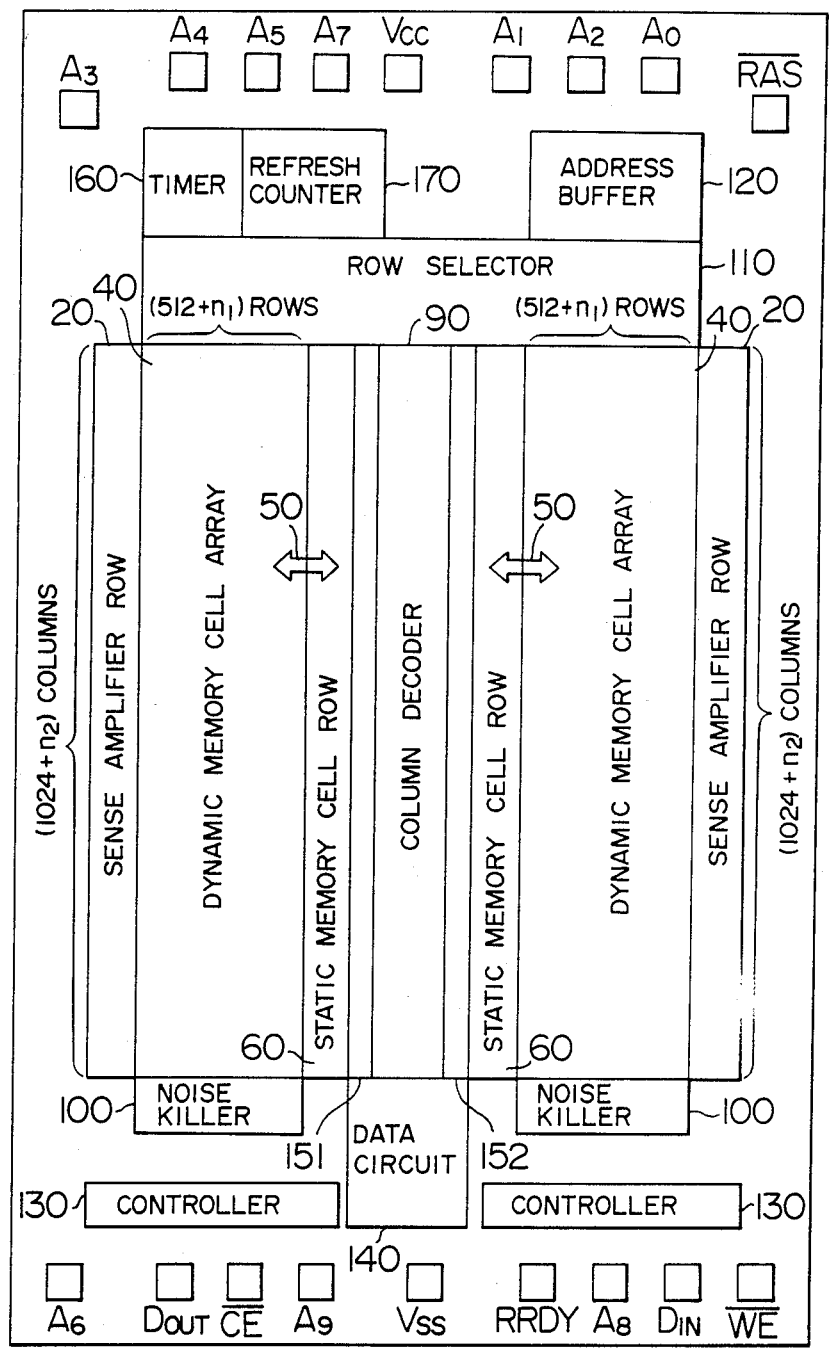
FIG. 2 is a view illustrating an embodiment of layout on a semiconductor chip of a semiconductor memory according to the present invention.

Referring to FIG. 2, there is shown a layout on a semiconductor chip according to the present embodiment. This semiconductor memory is constituted by 1 M (mega) word × 1 bit, and is provided with 10 address signal terminals A$_1$ to A$_9$. To the address signal terminals A$_1$ to A$_9$, address signals obtained by multiplexing a row address with a column address are input. The semiconductor memory is further provided with a chip enable signal terminal CE, an input data signal terminal D$_{in}$, an output data signal terminal D$_{out}$, a read/write signal terminal W, a row address strobe signal terminal RAS, and a refresh enable and ready signal terminal RRDY. The semiconductor memory is further provided with a power supply terminal V$_{DD}$, and a ground terminal V$_{SS}$.

In this embodiment, a memory cell array constituting the semiconductor memory includes a group of spare rows comprising 2n$_1$ rows and a group of spare columns comprising n$_2$ columns thereby to the render redundancy to bit configuration. Two groups of dynamic memory cell arrays 40 comprising dynamic memory cells 400 having (512+n$_1$) rows and (1024+n$_2$) columns are arranged on the right and left of the memory chip, respectively. Two sense amplifier row 20 each comprising (1024+n$_2$ sense amplifiers are coupled to respective bit line pair B and $\overline{B}$ of each dynamic memory cell array 40, respectively. Two static memory cell rows 60 each comprising (1024+n$_2$) static memories 600 are provided through the dynamic memory cell array 40 and transfer gate means 50 located on the left and right, respectively. These static memory cell rows 60 are located in the center of the memory cell array, and respectively arranged adjacent to data line pair 151 and 152 located on the left and right so as to interpose therebetween a column decoder 90 serving as column selector means. Each static memory cell 600 corresponding to column selected by the column decoder 90 is connected to the data line pair 151 and 152. Each word line 11$i$ constituting a row line of the dynamic memory cell array 40 is selectively driven by a row selector 110 serving as row selector means. Each word line 11$i$ is provided with a noise killer 100 for the purpose of preventing a potential appearing thereon from being floating potential. An address buffer 120 is provided for supplying address signals externally fed to the row selector 110 and the column decoder 90. Each row selector 110 is provided with a refresh counter 170 for supplying internal address signals for auto-refresh or self-refresh to the row selector 110, and a timer 160 for inputting counting inputs to the refresh counter 170. A data circuit 140 comprising data input circuit 141 and a data output circuit 142 is coupled to the data line pair 151 and 152.

The semiconductor memory device according to the present embodiment is further provided with two controllers 130 for controlling the overall circuits so that they are operative in synchronism with each other. Each control circuit 130 includes a clock generator to control various kinds of operations, read, write or refresh, etc. In this embodiment, two dynamic memory cell arrays 40 located on the left and the right are caused to operate by concurrently placing them in an enable condition. In this instance, the refresh cycle is determined as follows: the refresh is effected in such a manner that each row of the left and right dynamic memory cell array is synchronized with each other; each memory cell is refreshed every 4 ms. Accordingly, the refresh cycle number of the overall semiconductor memory is 512 refresh cycle/4 ms.

Figure 3:
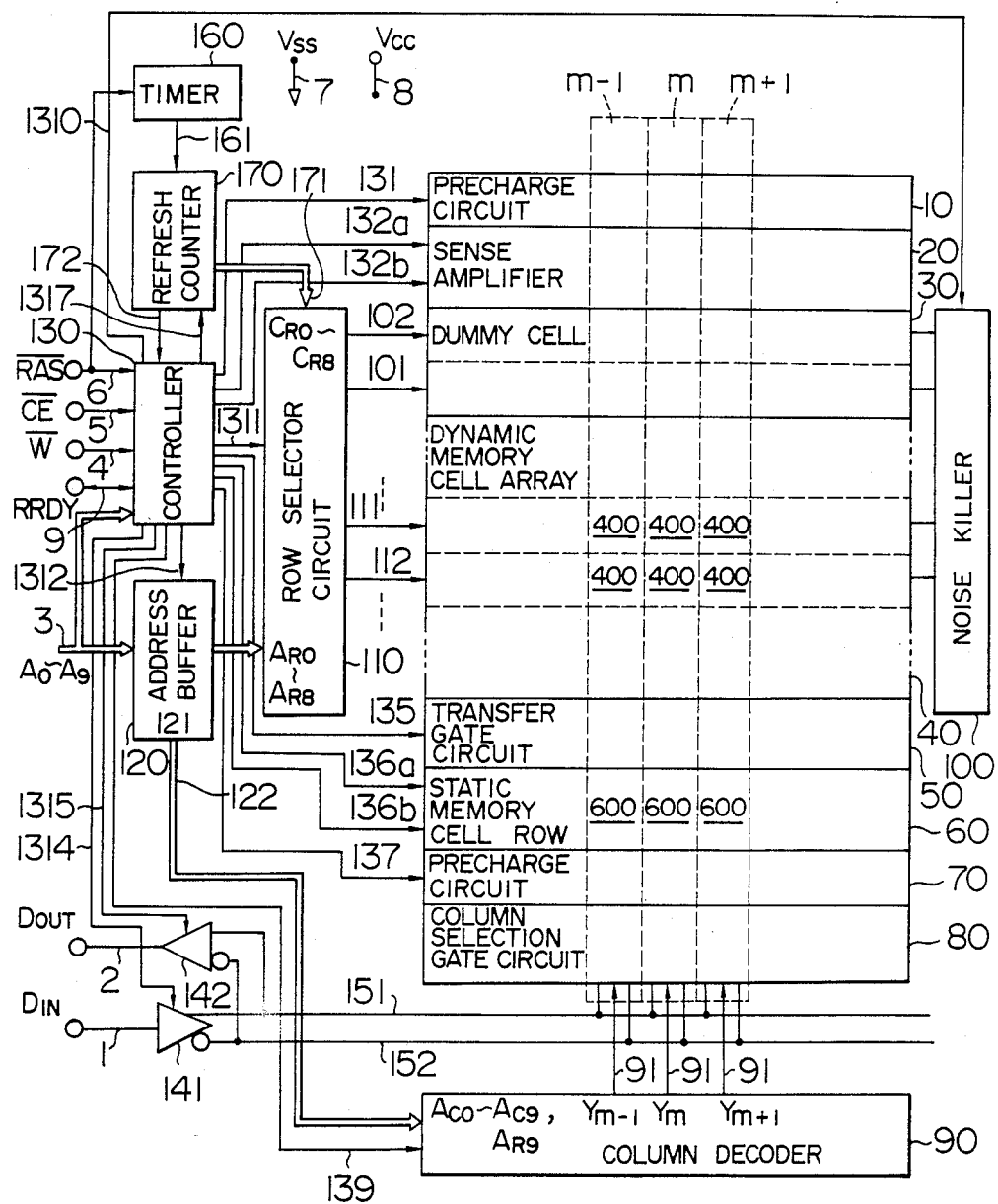
FIG. 3 shows a block diagram of the semiconductor memory shown in FIG. 2.

Referring now to FIG. 3, there is shown a functional block diagram of the semiconductor memory according to this embodiment. The dynamic memory cell array 40, the sense amplifier rows 20, static memory cell rows 60, data line pair 151 and 152, and row selector 110 which are parted to the left and right in FIG. 2 are illustrated with a single block in FIG. 3, respectively. Turning to FIG. 4, there is shown an example of the m-th column circuit including the sense amplifier row 20, the dynamic memory cell 400, the transfer gate circuit 50, the static memory cell 600 and the data line pair 151 and 152. The circuit shown in FIG. 4 further comprises a precharge circuit 10 for precharging the bit line pair B and $\overline{B}$, a dummy cell 30, a precharge circuit 70 for precharging the static memory cell 600, and a column selection gate circuit 80 for selectively connecting the static memory cell 600 and the data line pair 151 and 152 by the output signal $Y_m$ of the column decoder.

Figure 4:
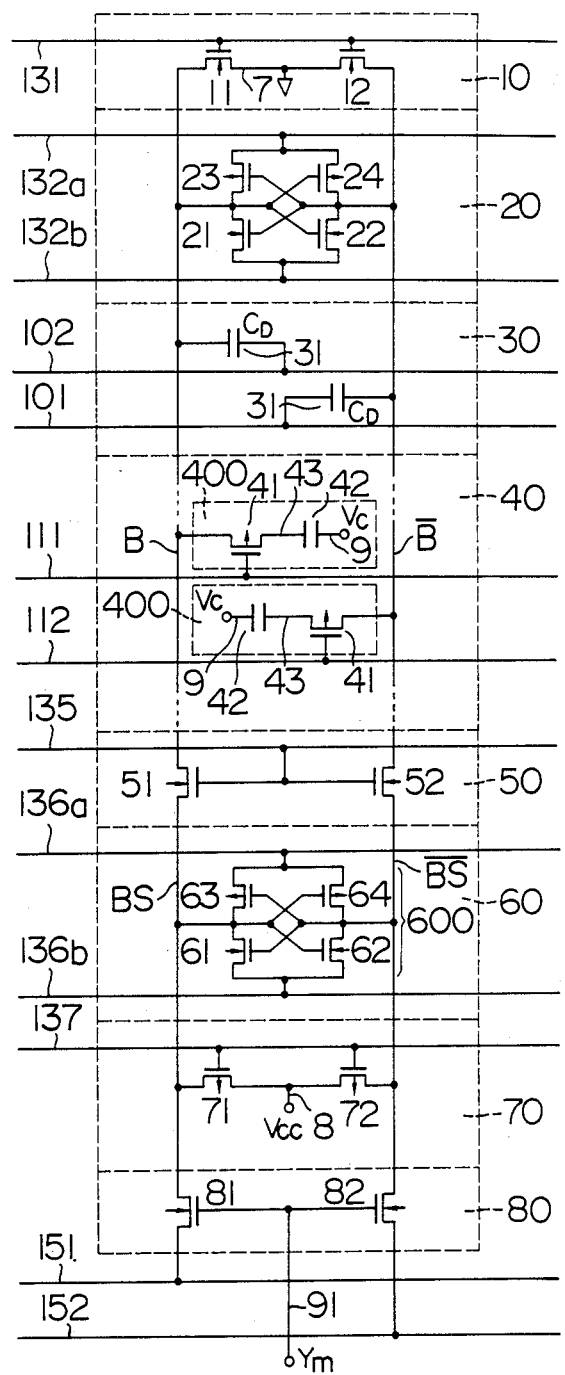
FIG. 4 is a circuit diagram illustrating the essential part of the semiconductor memory shown in FIG. 3.

As seen from FIG. 4 showing the circuit of the m-th column, the bit line pair B and $\overline{B}$ are connected to the ground line 7 through NMOS FETs 11 and 12, and each gate of NMOS FETs 11 and 12 is connected to a common signal line 131. The precharge circuit 10 is constituted by NMOS FETs 11 and 12. A sense amplifier 20 is coupled to the bit line pair B and $\overline{B}$. The sense amplifier comprises a cross connection circuit comprising PMOS FETs 23 and 24, and another cross connection circuit comprising NMOS FETs 21 and 22, wherein the drain of one FET is cross-connected to the gate of the other FET. The bit line B is connected to each drain of the PMOS FET 23 and the NMOS FET 21, while the bit line $\overline{B}$ is connected to each drain of the PMOS FET 24 and the NMOS FET 22. Each source of the cross-connected PMOS FETs 23 and 24 is connected to a sense signal line 132a of positive polarity, and each source of the cross-connected NMOS FETs 21 and 22 is connected to a sense signal line 132b of negative polarity. The sense operation is controlled by applying sense signals to these sense signal lines 132a and 132b. One end of each dummy capacitor 31 constituting dummy cell 30 is connected to bit lines B and $\overline{B}$, respectively, while the other end of each dummy capacitor 31 is connected to dummy word lines 101 and 102, respectively. These dummy cells 30 are utilized when sensing the dynamic memory cells 400. To the bit line pair B and $\overline{B}$, dynamic memory cells 400 are coupled, wherein the drain of each transfer FET 41 is connected to bit lines B and $\overline{B}$, respectively, and its gate is connected to word lines 111 and 112, respectively.

The bit lines B and $\overline{B}$ are connected to the static memory bit lines BS and $\overline{BS}$ through the transfer gate NMOS FETs 51 and 52. To the static memory bit lines BS and $\overline{BS}$, the static memory cell 600 is coupled. The static memory cell 600 comprises NMOS FETs 61 and 62, and PMOS FETs 63 and 64 in which the drain of one FET is cross-connected to the gate of the other FET. Each drain of the NMOS FET 61 and the PMOS FET 63 is connected to the static memory bit line BS. Each drain of the NMOS FET 62 and the PMOS FET 64 is connected to the static memory bit line $\overline{BS}$. Each source of the PMOS FETs 63 and 64 is commonly connected to a static memory control line 136a of positive polarity, and each source of the NMOS FETs 61 and 62 is commonly connected to a static memory control line 136b of negative polarity. Each of static memory bit lines BS and $\overline{BS}$ is connected to a power supply line 8 through PMOS FETs 71 and 72. Further, static memory bit lines BS and $\overline{BS}$ are connected to data line pair 151 and 152 through NMOS FETs 81 and 82, respectively. Each gate of NMOS FETs 81 and 82 is commonly connected to a Y decoder output line 91.

The circuit shown in FIG. 4 is aligned in the column direction by $(1024+n_2)$ columns, thereby to constitute the overall semiconductor memory shown in FIG. 3. The row selector 110 decodes either of external row address signals $A_{R0}$ to $A_{R8}$ and internal refresh addresses $C_{R0}$ to $C_{R8}$ designated by the refresh counter 170 to select one of $(512+n)$ word lines 111, 112, ... of the left and the right dynamic memory cell array 40 by output signals of the decoder thereby to output selection signals. The column decoder 90 selects a predetermined column $Y_m$ based on column address signals $A_{C0}$ to $A_{C9}$ and block selection address $A_{R9}$ thereby to selectively connect the single static memory cell 600 provided in the left and the right static memory cell row 60 with the column selection gate circuit 80. The data line pair 151 and 152 are connected to a data input terminal $D_{in}$ through a data input buffer 141, and are also connected to a data output terminal $D_{out}$ through a data output buffer 142. An input line 6 for the row address strobe signal $\overline{RAS}$ is connected to the timer 160. Counting input signals 161 which are input from the timer 160 to the refresh counter 170 are controlled by the row address strobe signal $\overline{RAS}$. The refresh counter 170 transmits signals to the controller 130 and receives them. For instance, the controller 130 controls counting operation of the refresh counter 170 by using a signal 1317. On the contrary, the refresh counter 170 informs the operating status to the controller 130 by using a status signal 172. The address buffer 120 classifies external addresses $A_0$ to $A_9$ into row addresses $A_{R0}$ to $A_{R8}$, column addresses $A_{C0}$ to $A_{C9}$ and block selection address $A_{R9}$ on the basis of a signal 1312 fed from the controller 130 to output them to the row selector 110 and the column decoder 90, respectively. The controller 130 receives address signals $A_0$ to $A_9$ to produce clock pulses in synchronism with a change of address signals. Further, the controller 130 receives the row address strobe signal $\overline{RAS}$, the chip enable signal $\overline{CE}$, the read/write signal $\overline{W}$, and the refresh enable and ready signal RRDY to produce various kinds of control signals. These control signals are as follows; a signal 1310 for controlling the noise killer 100, a signal 1317 for controlling the refresh counter 170, a precharge control signal 131 for bit lines B and $\overline{B}$, sense signals 132a and 132b which are fed to the sense amplifier 20, a signal 1311 which is fed to the row selector 110, a transfer gate signal 135 which is fed to the transfer gate circuit 50, control signals 136a and 136b which are fed to the static memory cell 600, a precharge control signal 137 for static memory bit lines BS and $\overline{BS}$, a control signal for the address buffer 120, a control signal 1314 for the data input buffer 141, a control signal 1315 for the data output buffer 142, etc.

The operation of this embodiment will be described with reference to FIGS. 5 to 7.

Figure 5:
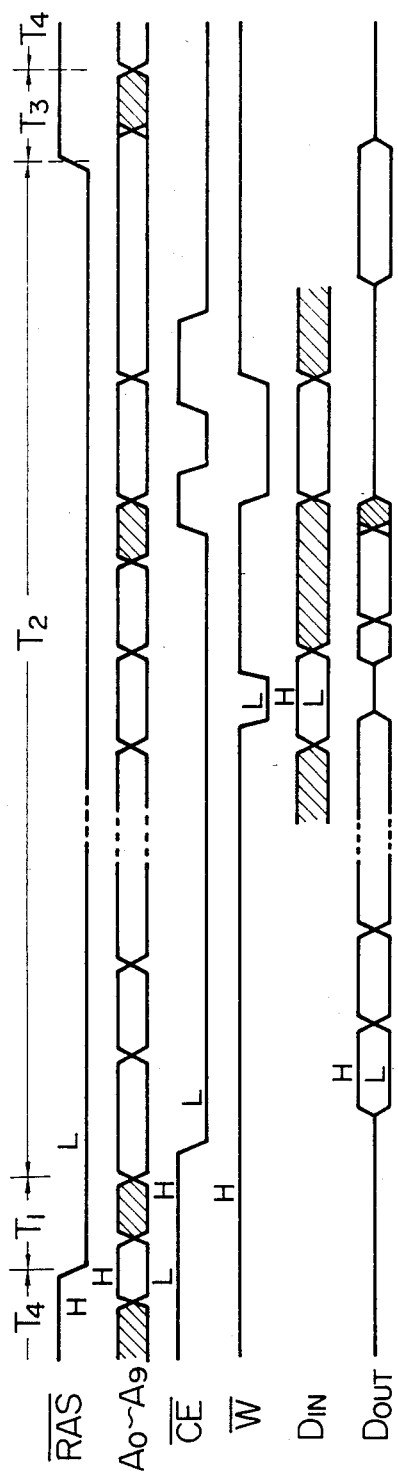
FIGS. 5, 6, 7(a) and 7(b) are time charts showing operations of the semiconductor memory of the invention, respectively.
Figure 6:
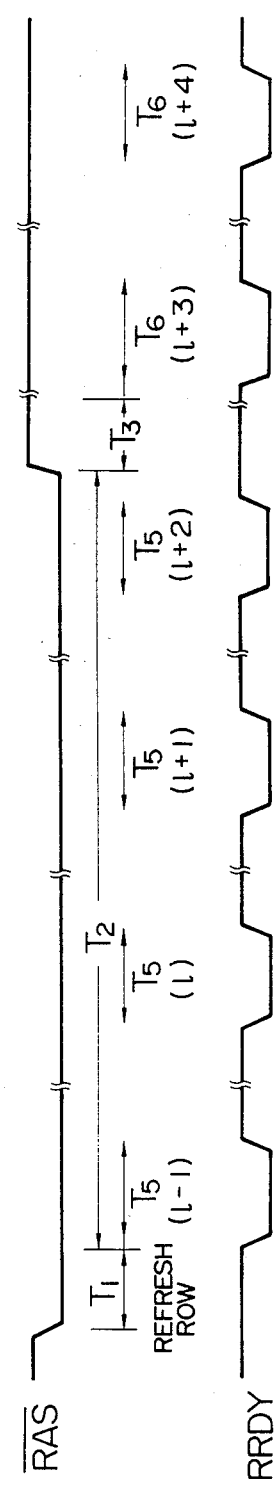

FIGS. 5 and 6 show operational timings of this embodiment.

The bit lines B and $\overline{B}$ are placed in precharge condition except for a refresh time period $T_6$ during a time period $T_4$ which starts from a time at which a predetermined time interval $T_3$ elapses after the row address strobe signal $\overline{RAS}$ is changed to "H" level. In synchronism with the falling from "H" level to "L" level of the row address strobe signal $\overline{RAS}$, the address signals $A_0$ to $A_9$ are input to the address buffer 120 as row address signals $A_{R0}$ to $A_{R8}$ and a block selection address $A_{R9}$ which serve as external signals. When external row address signals $A_{R0}$ to $A_{R8}$ are input, the row selector 110 decodes row address signals $A_{R0}$ to $A_{R8}$ to select a predetermined word line while it is clock-controlled by the control circuit 130. The information stored in the dynamic memory cell 400 corresponding to the selected row is amplified in synchronism with the row address strobe signal $\overline{RAS}$ by the sense amplifier circuit 20. Thus, the information stored in the left and right memory cells 400 which are $2\times(1024+n_2)$ in total is amplified by $2\times(1024+n_2)$ sense amplifier 20. Thereafter, each gate of the transfer gate circuit 50 is opened in synchronism with the row address strobe signal $\overline{RAS}$. As a result, the signals amplified by the sense amplifiers 20 are concurrently transferred to $2\times(1024+n_2)$ left and right memory cell rows 60. Assume that $T_1$ denotes a time interval from a time at which the transition from "H" level to "L" level of the row address strobe signal $\overline{RAS}$ is finished to a time at which the row selection, the sense amplifying operation and the transfer operation are finished. In this example, $T_1$ is about 40 nsec.

After the time period $T_1$, while the row address strobe signal $\overline{RAS}$ is placed in "L" level, viz. during a time period $T_2$, the semiconductor memory is operative as a static memory comprising $2\times(1024+n_2)$ static memory cells 600. This static memory operates in such a manner that the external address signals $A_0$ to $A_9$ serve as column addresses $A_{C0}$ to $A_{C9}$. It allows to exchange information between the static memory cell 600 corresponding to the column designated by the block selection address $A_{R9}$ and the column addresses $A_{C0}$ to $A_{C9}$, and data line pair 151 and 152 thereby to perform a read/write operation. During this time interval $T_2$, the transfer gate circuit 50 is placed in entirely closed condition. The static memory cell row 60 effects a read/write operation completely independent of the dynamic memory cell 40 and the sense amplifier 20. Namely, when the chip enable signal $\overline{CE}$ is "L" level, this chip is selected. In this condition, when the read/write signal $\overline{W}$ is "H" level, the static memory effects a read operation to output the information stored in the static memory cell 600 to the output terminal $D_{out}$. On the other hand, when the read/write signal $\overline{W}$ is "L" level, the information on the data input terminal $D_{in}$ is written into the static memory cells 600. During this time period $T_2$, the timer 160 instructs to set a self-refresh time period $T_5$ and to allow the refresh counter 170 to count up. The timer 160 effects a refresh operation, e.g. once every 6 μsec. Namely, the refresh operation is performed by decoding the internal refresh address signals $C_{R0}$ to $C_{R8}$ of the refresh counter 170 to sequentially select one of $(512+n_1)$ word lines coupled to the left and right dynamic memory cell array 40, thereby to read out the information of the selected dynamic memory cell row and to sense and amplify the information thus read by using the sense amplifier 20. Thus, when the refresh operation is completed, the concerned word lines are closed to count up the refresh counter 170 by one to precharge bit line pair B and $\overline{B}$. Thus, when about 6 μsec elapses after the l-th row is refreshed, the (l+1)-th row is refreshed. During this refresh time period, the semiconductor memory exchanges information between the static memory cell rows 60 and the data line pair 151 and 152. Namely, the read/write operation which is provided by the semiconductor memory is effected independent of the refresh operation. During this refresh time period $T_5$, the semiconductor memory outputs a refresh ready signal RRDY of "L" level to a signal terminal 9. The ready signal RRDY functions to indicate for an external device whether the semiconductor memory is placed in refresh condition or not. When the ready signal RRDY is "L" level, it indicates that the semiconductor memory is placed in refresh condition viz. the semiconductor memory is placed in the condition where a change of the row address strobe signal $\overline{RAS}$ is inhibited. A slight change of the circuit design makes it possible to start an auto-refresh operation without the timer 160 by a newly added refresh enable signal which has been externally and compulsorily fed to be "L" level.

Then, when the row address strobe signal $\overline{RAS}$ is shifted from "L" level to "H" level, the information stored in the static memory cell rows 60 is at a time transferred to the sense amplifier row 20 through the transfer gate circuit 50 in synchronism with the transition of the row address strobe signal $\overline{RAS}$. When the row address strobe signal $\overline{RAS}$ is shifted to "H" level, the external row address signals $A_{R0}$ to $A_{R8}$ last strobed are decoded. In accordance with this decoding operation, one word line is selected among lines coupled to the dynamic memory cell array 40 which corresponds to the contents of the static memory cell row 60. Thus, the information of the static memory cell row 60 is all written into the selected dynamic memory cell row, thereafter the word line is placed in non-selected condition. During a time period $T_3$, the information stored in the static memory cell row 60 is transferred to the sense amplifier row 20. The information thus transferred is written into the dynamic memory cell array 40 to effect the operation up to a time at which the word line is placed in nonselected condition. Thereafter, during a time period $T_4$ while the row address strobe signal $\overline{RAS}$ is "H" level, the self-refresh operation is effected every about 6 μsec.

As stated above, the semiconductor memory according to the present embodiment can perform the same operation as that of static memories in connection with rows which are row address-strobed. Further, the semiconductor memory of this embodiment can effect self-refresh operation with respect to dynamic memory cells independent of a read/write operation with respect to the static memory. Accordingly, this semiconductor memory has both advantages of high speed and low power dissipation obtained with static memories and advantage of high bit density packaging obtained with dynamic memories.

Figure 7A:
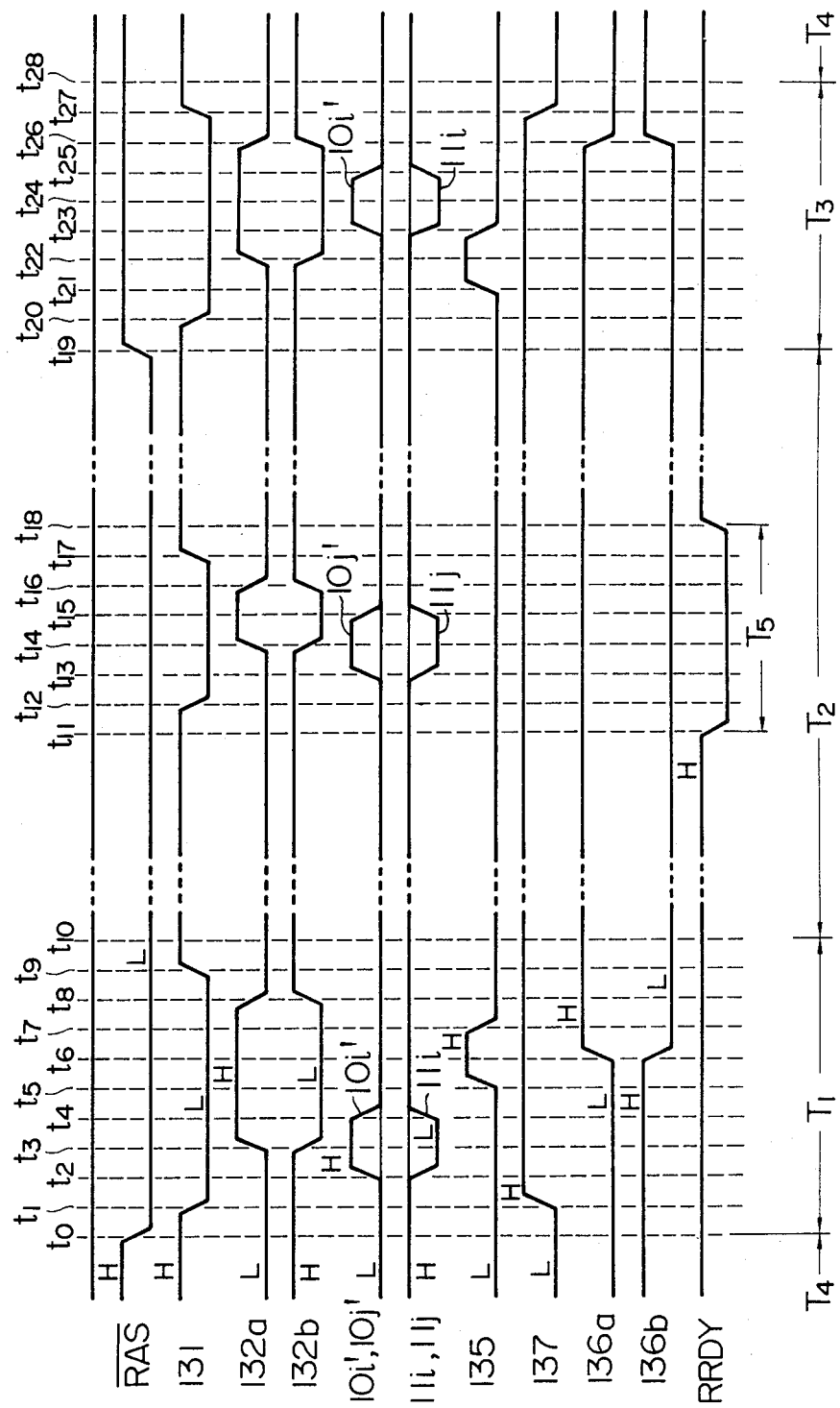
Figure 7B:
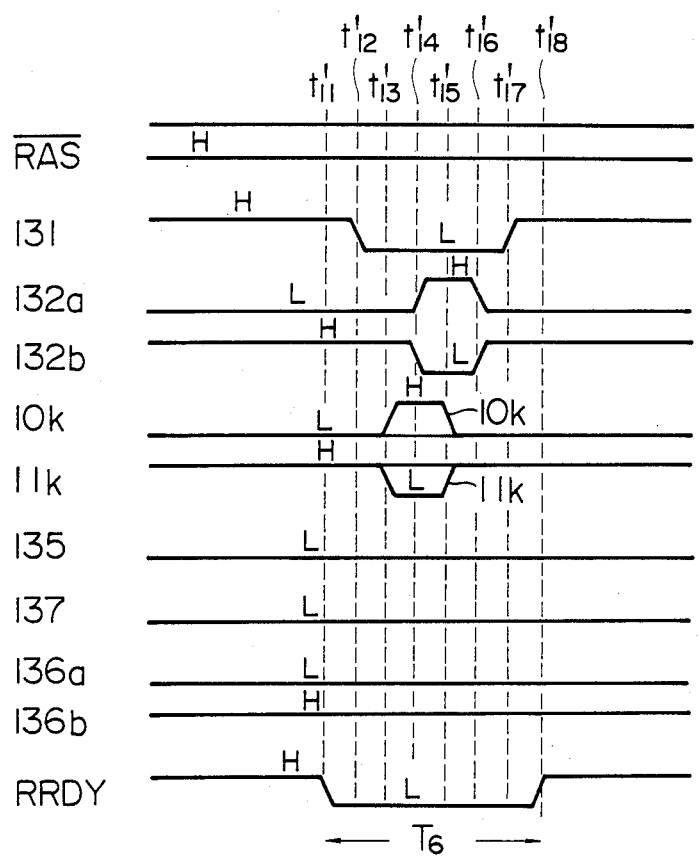

The operation of the circuit shown in FIG. 4 will be described with reference to FIGS. 7(a) and 7(b). Initially, the precharge signal line 131 is "H" level, and the precharge signal line 137 coupled to the static memory cell 600 is "L" level. Thus, NMOS FETs 11 and 12 provided in the precharge circuit 10 are conductive, and thereby the bit lines B and $\bar{B}$ are precharged "L" level. Likewise, PMOS FETs 71 and 72 provided in the precharge circuit 70 of the static memory cell 600 are conductive, and thereby static memory bit lines BS and $\overline{BS}$ are precharged "H" level.

When the row address strobe signal $\overline{RAS}$ is shifted from "H" level to "L" level at a time of $t_0$, in synchronism with this, external row address signals $A_{R0}$ to $A_{R8}$ and the block selection address $A_{R9}$ are read into. At a time of $t_1$, the precharge signal 131 becomes "L" level, and the precharge signal 137 of the static memory becomes "H" level. As a result, NMOS FETs 11 and 12, and PMOS FETs 71 and 72 are placed in nonconductive condition. Thus, the precharging operation is finished.

At a time of $t_2$, dummy word lines $10i'$ ($i'=1, 2$) are shifted from "L" level to "H" level, and word lines $11i$ ($i=1, 2, \ldots, 512$) selected by external row addresses $A_{R0}$ to $A_{R8}$ are shifted from "H" level to "L" level. Assume now that when i is an odd number, $i'=1$, while when i is an even number, $i'=2$. Thus, the transfer FET 41 of the i-th row of dynamic memory cells 400 becomes conductive, thereby to read out an information stored in the storage capacitor 42 and to supply it to the bit line B or the bit line $\bar{B}$. The capacitance of dummy capacitors 31 coupled to the dummy word line $10i'$ is set so as to be one half of that of the storage capacitor 42. The information stored in the dynamic memory cells 400 is read out to the bit line B or the bit line $\bar{B}$ as a voltage difference between bit line pair. For instance, if the word line 111 is selected, the dummy word line 101 is correspondingly selected. Let suppose that the capacitance of the storage capacitor 42 is $C_M$, the capacitance of the dummy capacitor 31 is $C_D$, and the capacitance of bit lines B and $\bar{B}$ is $C_B$. When the information stored in selected dynamic memory cells is "1", that is, a potential appearing at the node 43 between the transfer FET 41 and the storage capacitor 42 is $V_C$, potentials V(B) and V($\bar{B}$) appearing on bit lines B and $\bar{B}$ are expressed as follows:

$$V(B)_1 = \frac{C_M \cdot V_C}{C_M + C_B}$$

$$V(\bar{B})_1 = \frac{C_D \cdot V_C}{C_D + C_B},$$

where $C_D = \frac{1}{2}C_M$.

Assume that $C_M << C_B$. The above-mentioned equations are expressed as follows:

$$V(B)_1 \simeq \frac{C_M}{C_B} V_C$$

$$V(\bar{B})_1 \simeq \frac{C_M}{2C_B} V_C$$

$$V(B)_1 - V(\bar{B})_1 \simeq \frac{C_M}{2C_B}$$

In contrast, when the information stored in dynamic memory cells 400 is "0", that is, an electric potential at the node 43 is 0 volts, the above-mentioned equations are expressed as follows:

$$V(B)_0 = 0$$

$$V(\bar{B})_0 = \frac{C_D \cdot V_C}{C_D + C_B} \simeq \frac{C_M}{2C_B} V_C$$

$$V(B)_0 - V(\bar{B})_0 \simeq -\frac{C_M}{2C_B} V_C$$

At a time of $t_3$, the sense signal lines 132a and 132b of the sense amplifier 20 are shifted from "L" level to "H" level and from "H" level to "L" level, respectively. Thus, a sensing operation starts, and resultantly an infinitesimal potential difference between bit line pair B and $\bar{B}$ is amplified. As a result, when the information stored in dynamic memory cells 400 is "1", the potential on the bit line pair B and $\bar{B}$ is expressed as (V(B), V($\bar{B}$))=($V_C$, 0), while when the information stored therein is "0", it is expressed as (V(B), V($\bar{B}$))=(0, $V_C$). Thus, rewriting into dynamic memory cells 400 is effected. Thereafter, at a time of $t_4$, the dummy word line $10i'$ is returned to "L" level, and the word line $11i$ is returned to "H" level.

At a time of $t_5$, when the transfer gate signal 135 of the transfer gate circuit 50 is shifted from "L" level to "H" level, the transfer gate FETs 51 and 52 become conductive. Thus, potential signals of bit line pair B and $\bar{B}$ are transferred to static memory bit lines BS and $\overline{BS}$. Thereafter, at a time of $t_6$, static memory control lines 136a and 136b change from "L" level to "H" level and from "H" level to "L" level, respectively. Thus, the information stored in dynamic memory cells 400 is read into static memory cells 600 via the sense amplifier row 20 and bit lines B and $\bar{B}$. Then, at a time of $t_7$, the transfer gate circuit 50 becomes nonconductive. Thereafter, at a time of $t_8$, sense signal lines 132a and 132b change from "H" level to "L" level and from "L" level to "H" level, respectively. As a result, the sense amplifier row 20 is placed in disable condition. Further, at a time of $t_9$, the precharge signal 131 varies from "L" level to "H" level. As a result, the bit line pair B and $\bar{B}$ are both precharged 0 volts by the precharge circuit 10. Thus, the operation of the time period $T_1$ from the time $t_1$ to the time $t_{10}$ is realized.

The refresh operation being effected during a time period $T_5$ will be described.

When a self-refresh instruction is output once every about 6 $\mu$sec in accordance with a command fed from the timer circuit 160, the ready signal RRDY changes from "H" level to "L" level at a time of $t_{11}$. In synchronism with this, at a time of $t_{12}$, the precharge signal 131 changes from "H" level to "L" level. Thus, the precharge operation is finished. At a time of $t_{13}$, the word line $11j$ ($j=1, 2, \ldots, 512$) and the dummy word line $10j'$ (when j is an odd number, $j'=1$, while when j is an even number, $j'=2$) are selected, wherein these word lines correspond to the row selected by internal refresh address signals $C_{R0}$ to $C_{R8}$ produced from the refresh counter 170. As a result, the information stored in the j-th dynamic memory cell 400 is read out to bit line pair B and $\bar{B}$ as an infinitesimal potential difference. At a time of $t_{14}$, the sense signal lines 132a and 132b becomes active. As a result, the sense amplifier 20 is latched, and bit line pair B and $\bar{B}$ are sense-amplified to be rewritten to the j-th dynamic memory cell 400. Namely, the information stored in the dynamic cell 400 corresponding to the j-th row is refreshed. Then, at a time of $t_{15}$, the word line $11j$ and the dummy word line $10j'$ are placed in non-selected condition. At a time of $t_{16}$, by placing sense signal lines 132a and 132b in "L" level and "H" level, respectively, the latch of the sense amplifier 20 is relieved. At a time of $t_{17}$, the precharge signal 131 is changed to "H" level so that the bit line pair B and $\bar{B}$ are precharged 0 volts. At a time of $t_{18}$, the ready signal RRDY varies from "L" level to "H" level. A time period from a time $t_{11}$ to a time $t_{18}$ up to the reopening of the precharge is defined by a time period $T_5$ for a refresh operation.

After the time period $T_5$, when the row address strobe signal $\overline{RAS}$ shifts from "L" level to "H" level, the semiconductor memory according to this embodiment operates as follows: The row address strobe signal $\overline{RAS}$ changes to "H" level at a time of $t_{19}$. In response to this, at a time of $t_{20}$, the precharge signal 131 changes to "L" level. As a result, a precharge operation effected in the precharge circuit 10 coupled to the bit lines B and $\bar{B}$ is finished. Then, at a time of $t_{21}$, the transfer gate signal 135 varies from "L" level to "H" level. As a result, the information stored in static memory cells 600 is transferred to bit lines B and $\bar{B}$ placed in precharged condition. Thereafter, at a time of $t_{22}$, sense signal lines 132a and 132b become active, respectively, resulting in the latch of the sense amplifier 20. Thus, the information stored in the static memory cells 600 is amplified by the sense amplifier 20 and latched therein. Thereafter, at a time of $t_{23}$, the transfer gate signal 135 changes to "L" level. Thus, the transfer operation is finished, and the word line 11j and the dummy word line 10i' corresponding to the j-th row selected by external row address signals $A_{R0}$ to $A_{R8}$ which have been input at a time of $t_0$ are selected. Thus, the information of static memory cells 600 is written into dynamic memory cells 400 of the j-th selected row via bit lines B and $\bar{B}$ and the sense amplifier 20. At a time of $t_{24}$, there is no state change. Then, at a time of $t_{25}$, the word line 11 and the dummy word line 10i' are returned to the initial state. At a time of $t_{26}$, sense signal lines 132a and 132b are changed to "L" level and "H" level, respectively. Thus, the latch of the sense amplifier 20 is relieved.

At the same time, by placing static memory control lines 136a and 136b in "L" level and "H" level, respectively, writing into static memory cells 600 is inhibited. Then, at a time of $t_{27}$, the precharge signal line 131 of bit lines B and $\bar{B}$ is changed to "H" level, and the precharge signal line 137 of static memory bit lines BS and $\overline{BS}$ is shifted to "L" level. Thus, bit line pair B and $\bar{B}$ and static memory bit lines BS and $\overline{BS}$ start a precharge toward "L" level and "H" level, respectively.

As stated above, during a time period $T_3$ from a time $t_{19}$ to a time $t_{28}$ followed by a time $t_{27}$, the transfer of the information from the static memory cell rows 60 to the dynamic memory cell rows is realized. Moreover, during a time period from a time of $t_{11}'$ to a time of $t_{18}'$ corresponding to a time period $T_6$ for a refresh operation within the time period $T_4$ during which the row address strobe signal $\overline{RAS}$ is "H" level after the time period $T_3$, as shown in FIG. 7(b), the same refresh operation as that during the time period $T_5$ is effected. This self-refresh operation is effected by counting up internal refresh addresses $C_{R0}$ to $C_{R8}$ every about 6 μsec in accordance with a command fed from the internal timer circuit 160.

Figure 8A:
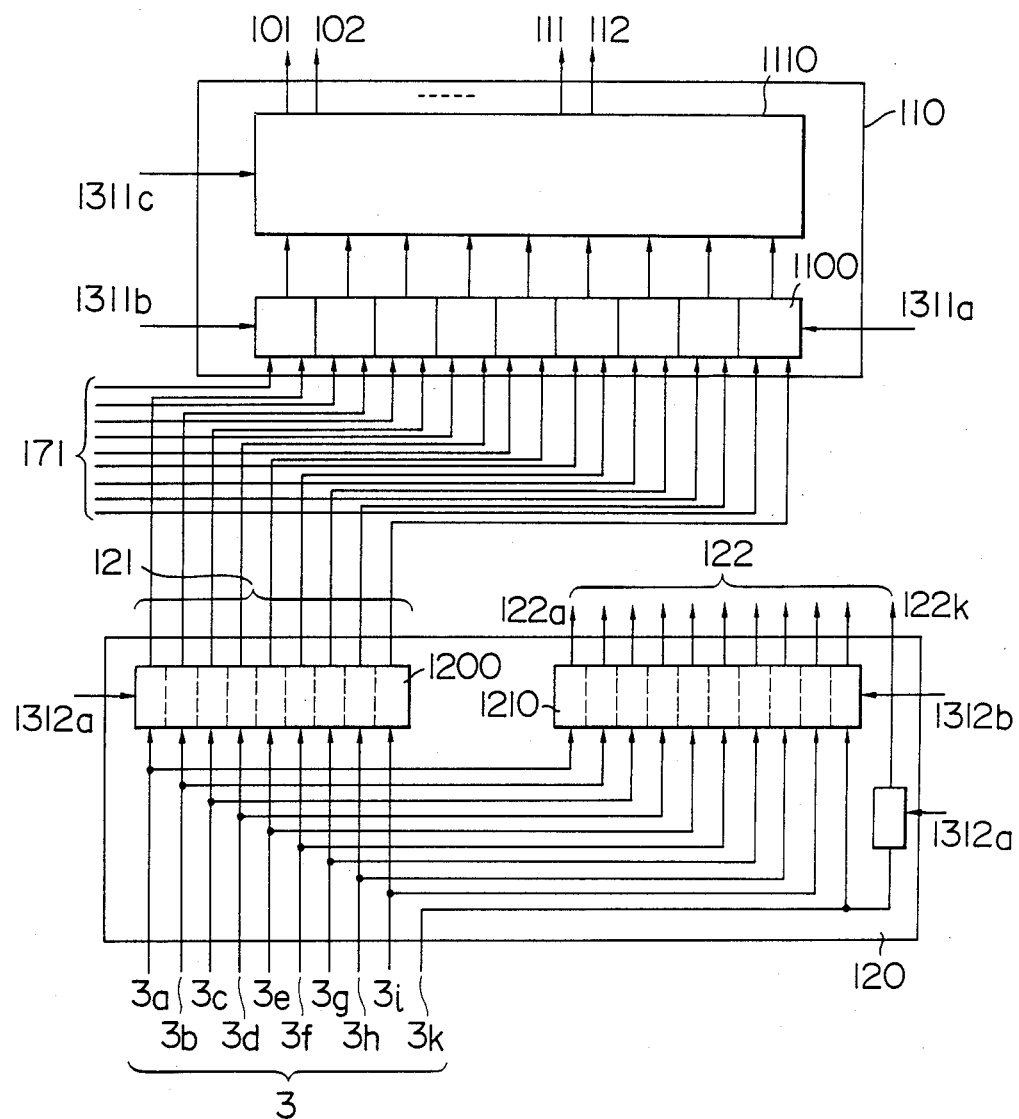
FIG. 8(a) is a circuit diagram illustrating an example of an address buffer circuit and a row selector circuit provided in the semiconductor memory circuit of the invention.

Referring now to FIG. 8(a), there is shown a preferred embodiment of the address buffer 120 and the row selector 110 used in the semiconductor memory according to the present embodiment. External address signals $A_0$ to $A_9$ are input to the external address signal input terminals 3a to 3k. Among them, external address signal $A_0$ to $A_8$ are input to a row address latch circuit 1200, and then latched by a latch signal 1312a which is synchronized with the row address strobe signal $\overline{RAS}$. External address signals $A_0$ to $A_9$ are also input to a column address latch circuit 1210. The column address latch circuit 1210 is controlled by a control signal 1312b to produce column addresses $A_{C0}$ to $A_{C9}$. The external address signal $A_9$ is latched by a latch signal 1312a which is synchronized with the row address strobe signal $\overline{RAS}$. Thus, the block selection address signal $A_{R9}$ is obtained.

The row selector 110 comprises a multiplexer 1100, and a row decoder/word line driving circuit 1110. The multiplexer 1100 selects either a group of output signals 121 of the row address latch circuit 1200 or a group of output signals 171 of the refresh counter 170 in accordance with multiplexer control signals 1311a and 1311b to output the selected one to the row decoder/word line driving circuit 1110. The driving circuit 1110 drives the row decoder and word lines under the control of a control signal 1311c.

Figure 8B:
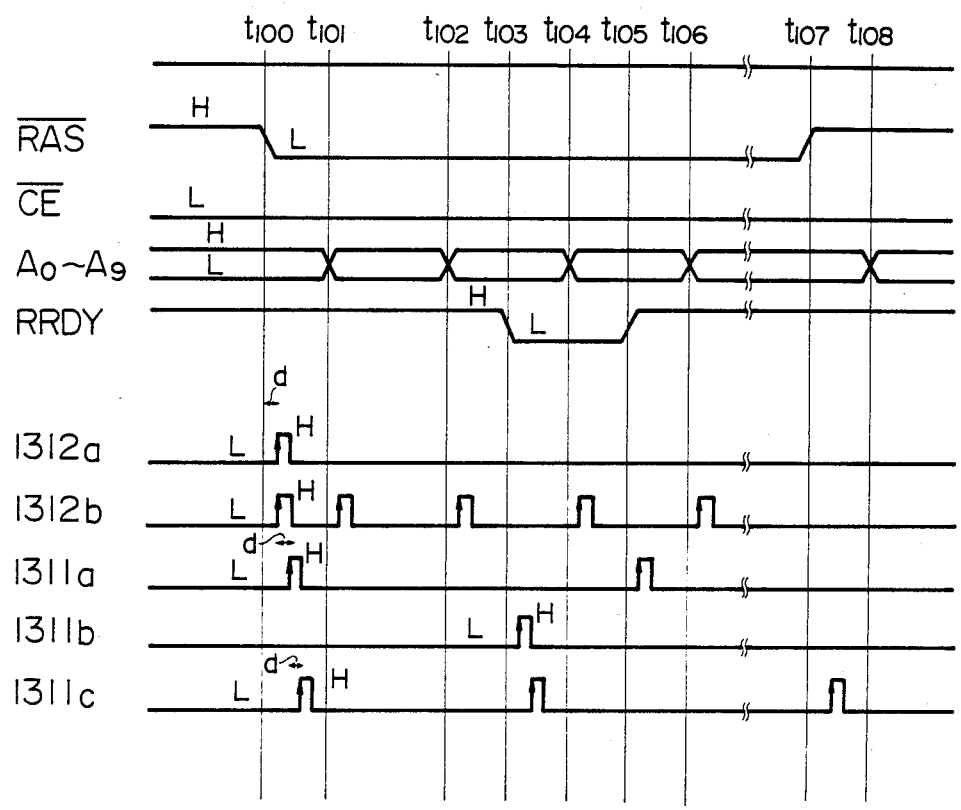
FIG. 8(b) is a time chart showing an example of operations of the circuits shown in FIG. 8(a).

Its operation will be referred to below with reference to a time chart shown in FIG. 8(b).

The row address latch circuit 1200 latches external address signals $A_0$ to $A_8$ in correspondence with the rising from "L" level to "H" level of the latch signal 1312a. Likewise, the column address latch circuit 1210 latches external address signals $A_0$ to $A_9$ in correspondence with the rising of the latch signal 1312b. The latch signal 1312b is output in synchronism with the falling of the row address strobe signal $\overline{RAS}$ or changes of external address signals $A_0$ to $A_9$. The control signal 1311a is output in synchronism with the falling of the row address strobe signal $\overline{RAS}$ and the rising of the ready signal RRDY. In synchronism with this rising of the signal 1311a, the multiplexer 1100 selects output external address signals 121 to continue to output them. The control signal 1311b is output in synchronism with an output which is synchronized with the falling of the ready signal RRDY in accordance with the output of the timer 160. In synchronism with the rising of the signal 1311b, the multiplexer 1100 selects output external refresh address signals 171 to continue to output them. The row decoder/word line driving circuit 1110 is controlled by the control signal 1311c in synchronism with the falling and the rising of the row address strobe signal $\overline{RAS}$, and the falling of the ready signal RRDY.

According to this embodiment, after an information is transferred from the dynamic memory cell row selected by external signals $A_{R0}$ to $A_{R8}$ which are selected by the address strobe signal $\overline{RAS}$ to the static memory cell row, it is possible to allow the semiconductor memory to be operative as a static memory with respect to changes of the column addresses. At this time, it is further possible to independently effect a refresh operation by making use of dynamic memory cell array 40 and sense amplifier row 20.

As stated above, the present invention makes it possible to operate the semiconductor memory as a static memory in respect to read/write operations, and independently effect refresh operations of the dynamic memory cell array during read/write operations. Accordingly, the advantages obtained with the semiconductor memory according to the present invention are as follows: First, it is possible to obtain advantage of high speed operation which is a feature of a static memory and the advantage of high bit density which is a feature of a dynamic memory. Second, it is possible to effect a read/write operation at a high speed with respect to changes of row addresses without limitation of cycle number of a column address change and an accumulated cycle time. Third, it is possible to provide a large capacity semiconductor memory capable of independently effect a read/write operation during a self-refresh operation. Fourth, when accessing the same address row, it is unnecessary to repeatedly effect row selection operation, resulting in high speed and low power dissipation.

What is claimed is:

1. In a semiconductor memory comprising a dynamic memory cell array having a plurality of rows of volatile dynamic memory cells for storing information, said volatile dynamic memory cells being arranged in the row and column directions in a matrix manner, word lines commonly connected in the row direction to said volatile dynamic memory cells in said dynamic memory cell array, bit lines commonly connected in the column direction to said volatile dynamic memory cells in said dynamic memory cell array, and a sense amplifier row having sense amplifiers for sense-amplifying a potential difference between paired bit lines, the improvement comprising:
(a) a static memory cell row having volatile static memory cells corresponding to said dynamic memory cells located in the row direction in said dynamic memory cell array; and C
(b) transfer gate means for transferring information between said volatile static memory cells in said static memory cell row and the corresponding volatile dynamic memory cells of a desired row of said dynamic memory cell rows such that information of said desired row of said dynamic memory cell rows in said dynamic memory cell array is transferred to said static memory cell row.

2. In a semiconductor memory comprising a dynamic memory cell array wherein dynamic memory cells for storing information therein are arranged in row and column directions in a matrix manner, word lines commonly connected in the row direction to said dynamic memory cells in said dynamic memory cell array, bit lines commonly connected in the column direction to said dynamic memory cells in said dynamic memory cell array, and a sense amplifier row having sense amplifiers for sense-amplifying a potential difference between paired bit lines, the improvement comprising:
a static memory cell row having static memory cells corresponding to said dynamic memory cells located in the row direction in said dynamic memory cell array;
transfer gate means for transferring information between said static memory cells in said static memory cell row and the corresponding dynamic memory cells;
row selection means for selecting a word line of a dynamic memory cell row of a desired row address in said dynamic memory cell array; and
column selection means for selecting a static memory cell of a desired column address in said static memory cell row,
thereby transferring the information of said dynamic memory cell row commonly connected to said word line selected by said row selection means to said static memory cell row with said transfer gate means, effecting a read/write operation with respect to the static memory cell of said desired column address through a data line connected by said column selection means, transferring the information of said static memory cell row, to which said read/write operation has been effected, to said dynamic memory cell row commonly connected to the word line selected by said row selection means with said transfer gate means, and rewriting the information to said dynamic memory cell row.

3. A semiconductor memory according to claim 2, wherein said row selection means comprises a refresh counter producing internal row address signals for a self-refresh which is counted up every a predetermined time period, thereby self-refreshing the information of the dynamic memory cell row corresponding to row address designated by internal row address signals produced from said refresh counter with said sense amplifier row.

4. A semiconductor memory according to claim 3, wherein a read/write operation to said static memory cells during the refresh operation of said dynamic memory cells is enabled by interrupting said static memory cells and said dynamic memory cells with said transfer gate means.

* * * * *

UNITED STATES PATENT AND TRADEMARK OFFICE
CERTIFICATE OF CORRECTION

PATENT NO. : 4,608,666
DATED : Aug. 26, 1986
INVENTOR(S) : Yukimasa UCHIDA

It is certified that error appears in the above—identified patent and that said Letters Patent is hereby corrected as shown below:

IN THE CLAIMS:

Column 13, Claim 1, line 30, kindly delete "C" after "and".

Signed and Sealed this

Tenth Day of March, 1987

Attest:

DONALD J. QUIGG

Attesting Officer

Commissioner of Patents and Trademarks